United States Patent
Shimamoto et al.

(10) Patent No.: US 10,115,583 B2
(45) Date of Patent: Oct. 30, 2018

(54) METHOD OF MANUFACTURING SEMICONDUCTOR DEVICE

(71) Applicant: HITACHI KOKUSAI ELECTRIC INC., Toyko (JP)

(72) Inventors: Satoshi Shimamoto, Toyama (JP); Hiroshi Ashihara, Toyama (JP); Kazuyuki Toyoda, Toyama (JP); Naofumi Ohashi, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 12 days.

(21) Appl. No.: 15/687,717

(22) Filed: Aug. 28, 2017

(65) Prior Publication Data

US 2018/0233348 A1 Aug. 16, 2018

(30) Foreign Application Priority Data

Feb. 16, 2017 (JP) .................................. 2017-026850

(51) Int. Cl.
*H01L 21/02* (2006.01)
*H01L 21/311* (2006.01)
*H01L 27/11582* (2017.01)
*C23C 16/50* (2006.01)
*C23C 16/34* (2006.01)
(Continued)

(52) U.S. Cl.
CPC ........ *H01L 21/0217* (2013.01); *C01B 21/068* (2013.01); *C23C 16/345* (2013.01); *C23C 16/50* (2013.01); *H01L 21/022* (2013.01); *H01L 21/02274* (2013.01); *H01L 21/31111* (2013.01);
(Continued)

(58) Field of Classification Search
CPC ........... H01L 21/0217; H01L 21/02274; C01B 21/068
See application file for complete search history.

(56) References Cited

U.S. PATENT DOCUMENTS 8,741,394 B2 * 6/2014 Haverkamp ............ C23C 16/24
427/534
2010/0243999 A1 9/2010 Ishikawa
(Continued)

FOREIGN PATENT DOCUMENTS

JP 2015-050466 A 3/2015
KR 20100038438 A 4/2010
(Continued)

OTHER PUBLICATIONS

Korean Office Action dated Jun. 21, 2018 for the Korean Patent Application No. 2017-0106890.

*Primary Examiner* — Jose R Diaz
(74) *Attorney, Agent, or Firm* — Volpe and Koenig, P.C.

(57) ABSTRACT

There is provided a method of manufacturing a semiconductor device which includes: supplying a process gas to a process chamber in a state in which a substrate with an insulating film formed thereon is mounted on a substrate support part inside the process chamber; supplying a first power from a plasma generation part to the process chamber to generate plasma and forming a first silicon nitride layer on the insulating film; and supplying a second power from an ion control part to the process chamber in parallel with the generation of plasma, to form a second silicon nitride layer having lower stress than that of the first silicon nitride layer on the first silicon nitride layer.

19 Claims, 12 Drawing Sheets

(51) Int. Cl.
*C01B 21/068* (2006.01)
*H01L 21/28* (2006.01)
*H01L 27/11565* (2017.01)

(52) U.S. Cl.
CPC .. *H01L 27/11582* (2013.01); *H01L 21/28282* (2013.01); *H01L 27/11565* (2013.01)

(56) References Cited

U.S. PATENT DOCUMENTS

2015/0060992 A1 3/2015 Taekyung et al.
2016/0064193 A1 3/2016 Kim et al.

FOREIGN PATENT DOCUMENTS

KR 101503258 B1 3/2015
KR 20160028601 A 3/2016

\* cited by examiner

METHOD OF MANUFACTURING SEMICONDUCTOR DEVICE

CROSS-REFERENCE TO RELATED APPLICATION

This application is based upon and claims the benefit of priority from Japanese Patent Application No. 2017-026850, filed on Feb. 16, 2017, the entire contents of which are incorporated herein by reference.

TECHNICAL FIELD

The present disclosure relates to a method of manufacturing a semiconductor device.

BACKGROUND

Recently, semiconductor devices tend to be highly integrated. As one method of realizing this, a three-dimensional structure in which electrodes or the like are three-dimensionally arranged has been proposed.

In a process of forming a three-dimensional structure of a flash memory, it is necessary to alternately laminate an insulating film and a sacrificial film. However, due to a difference in thermal expansion coefficient between the insulating film and the sacrificial film, stress is applied to a silicon wafer, causing a phenomenon in which the laminated film is broken down in the formation process of the three-dimensional structure. Such a phenomenon may lead to a degradation in characteristics of the semiconductor device.

SUMMARY

Some embodiments of the present disclosure provide a technique capable of forming a semiconductor device with excellent characteristics even in a flash memory having a three-dimensional structure.

According to one embodiment of the present disclosure, there is provided a method of manufacturing a semiconductor device, including: supplying a process gas to a process chamber in a state in which a substrate with an insulating film formed thereon is mounted on a substrate support part inside the process chamber; supplying a first power from a plasma generation part to the process chamber to generate plasma and forming a first silicon nitride layer on the insulating film; and supplying a second power from an ion control part to the process chamber in parallel with the generation of plasma, to form a second silicon nitride layer having lower stress than that of the first silicon nitride layer on the first silicon nitride layer.

DETAILED DESCRIPTION

First Embodiment

Embodiments of the present disclosure will now be described.

Figure 1:
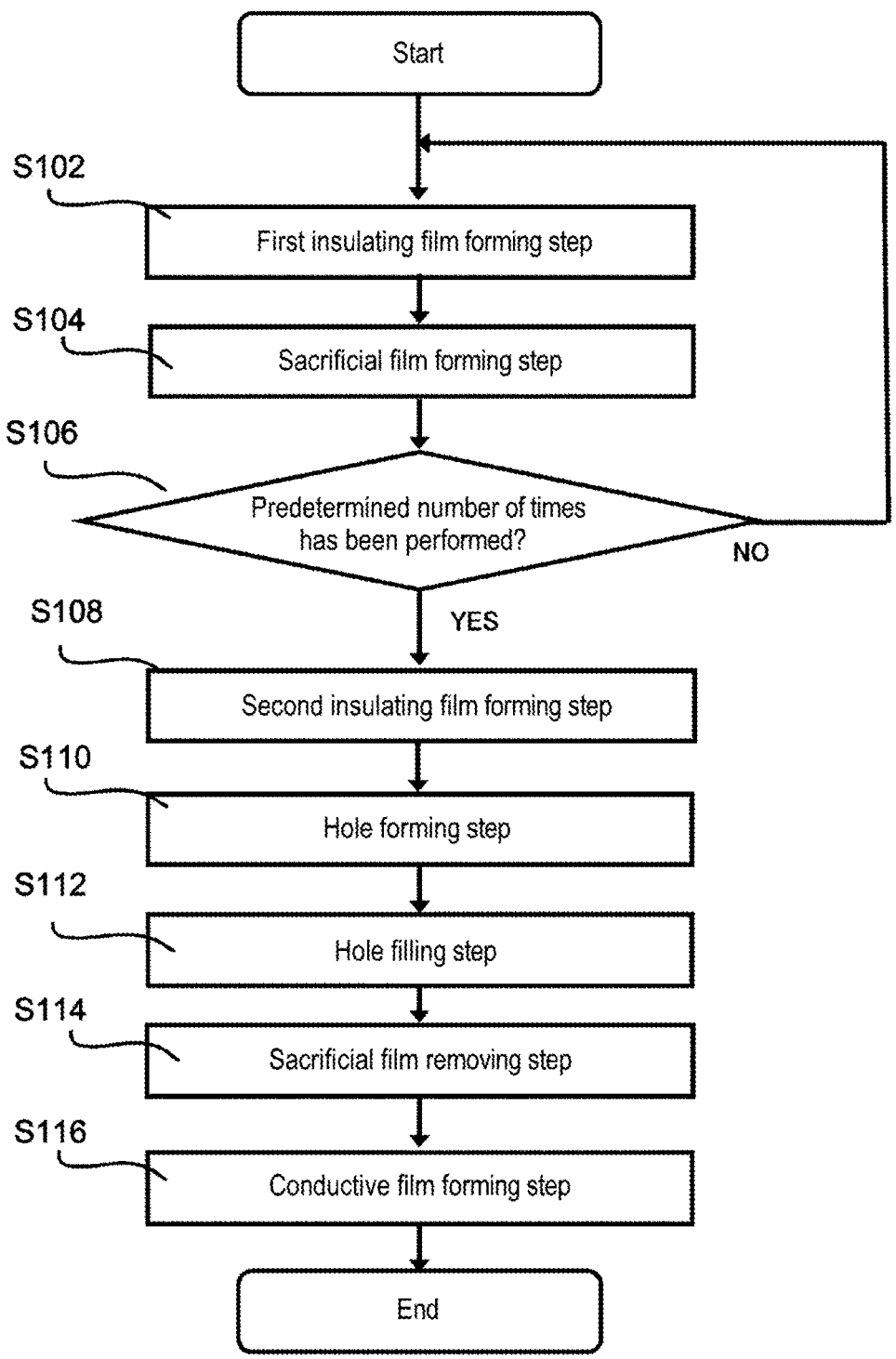
FIG. 1 is an explanatory view illustrating a manufacturing flow of a semiconductor device according to an embodiment of the present disclosure.
Figure 8:
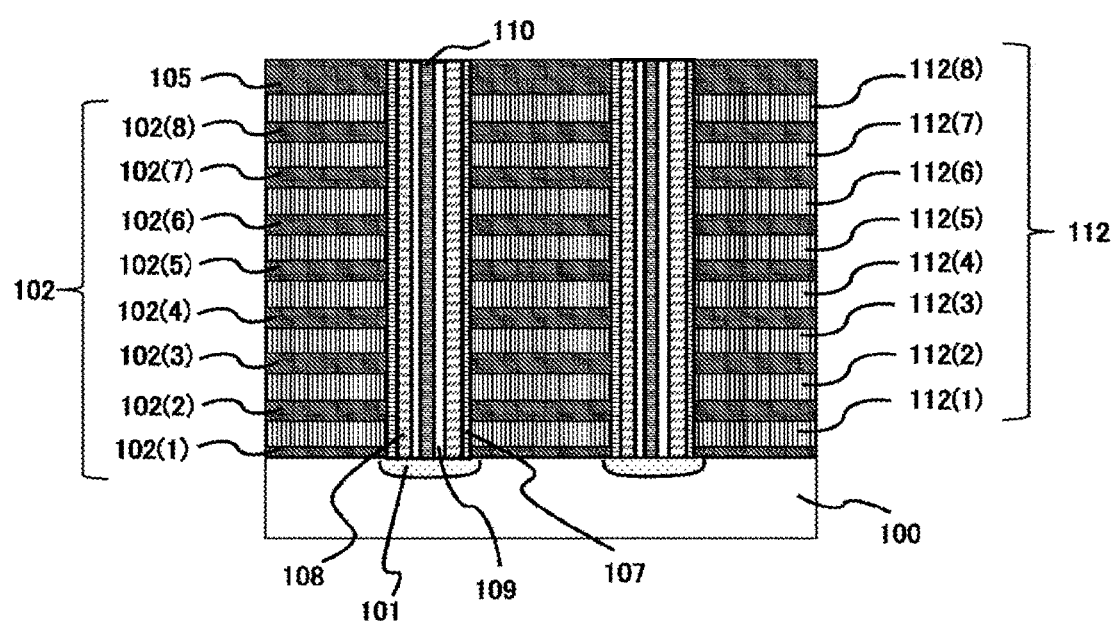
FIG. 8 is an explanatory view illustrating a process state of a wafer according to an embodiment.

One of the processes of manufacturing a semiconductor device will be described with reference to FIG. 1. In this process, a semiconductor device having a three-dimensional structure in which electrodes are three-dimensionally arranged is formed. As illustrated in FIG. 8, this semiconductor device has a laminate structure in which an insulating film 102 and an electrode 112 are alternately laminated on a wafer 100 as a substrate. A specific flow will be described hereinbelow.

(S102)

Figure 2:
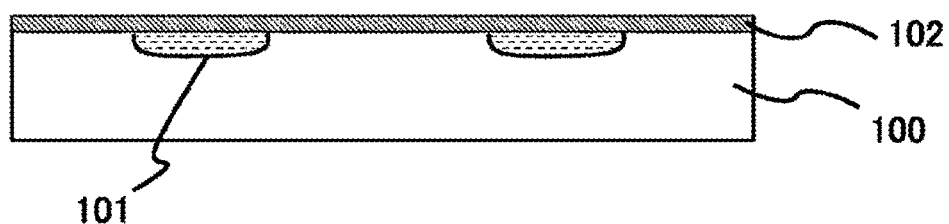
FIG. 2 is an explanatory view illustrating a process state of a wafer according to an embodiment.

A first insulating film forming step S102 will be described with reference to FIG. 2. FIG. 2 is a view illustrating an insulating film 102 formed on a wafer 100. A common source line (CSL) 101 is formed in the wafer 100. The insulating film 102 will also be referred to as a first insulating film.

At this step, the insulating film 102 is formed on the wafer 100. The insulating film 102 is formed by a silicon oxide (SiO) film. The insulating film 102 is formed by heating the wafer 100 to a predetermined temperature and supplying a silicon-containing gas having a silicon component as a main ingredient and an oxygen-containing gas having an oxygen component as a main ingredient onto the wafer 100. This processing is performed by an oxide film forming apparatus configured as a general apparatus.

(S104)

Figure 3:
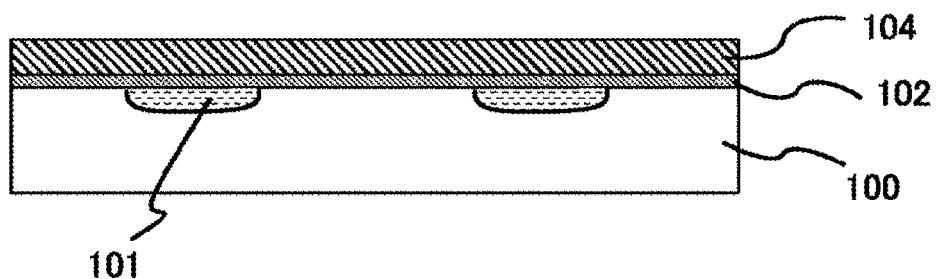
FIG. 3 is an explanatory view illustrating a process state of a wafer according to an embodiment.

A sacrificial film forming step S104 will be described with reference to FIG. 3. At this step, a sacrificial film 104 is formed on the insulating film 102. The sacrificial film 104 is removed in a sacrificial film removing step S114 which will be described later, and has an etching selectivity to the insulating film 102. The etching selectivity refers to a property in which the sacrificial film is likely to be etched and the insulating film is unlikely to be etched when being exposed to an etchant.

The sacrificial film 104 is formed by, for example, a silicon nitride (SiN) film. The sacrificial film 104 is formed by heating the wafer 100 to a predetermined temperature and supplying a silicon-containing gas having a silicon component as a main ingredient and a nitrogen-containing gas having a nitrogen component as a main ingredient onto the wafer 100. As will be described hereinbelow, the silicon-containing gas contains an impurity such as, e.g., chlorine or the like. Details thereof will be described later. However, due to a difference in formation mechanism, a heating temperature of the wafer 100 in the sacrificial film forming step S104 is different from that in the insulating film forming step S102. The silicon-containing gas and the nitrogen-containing gas used in this step will be collectively referred to as a sacrificial film forming gas, or simply to a process gas.

When forming the sacrificial film 104, a film stress of the sacrificial film 104 is processed such that it approximates a film stress of the insulating film 102.

Figure 15:
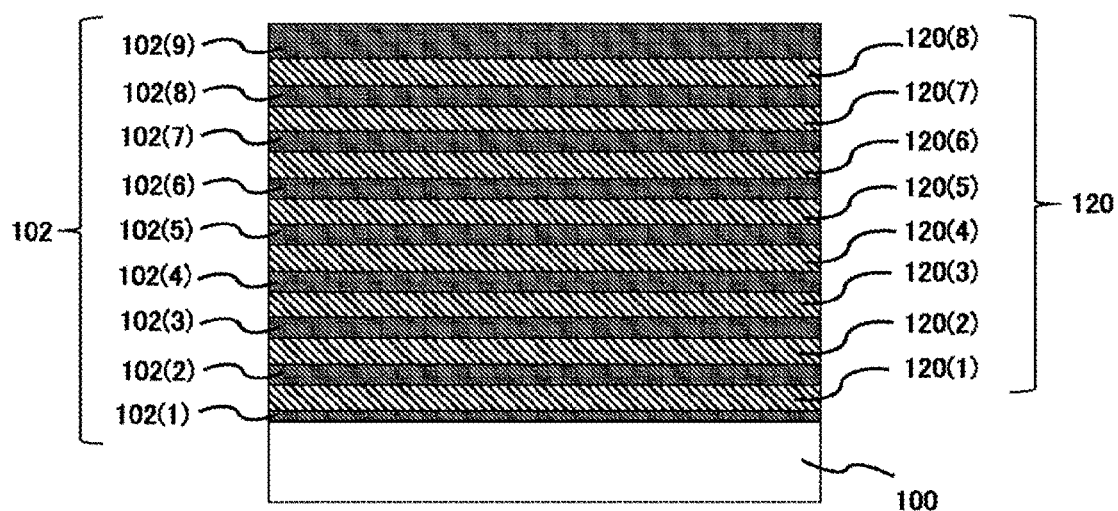
FIG. 15 is an explanatory view illustrating a process state of a wafer according to Comparative example.

Hereinafter, the reason for approximating the film stress will be described with reference to FIG. 15 which is the Comparative example. In FIG. 15, as an example, a case where the sacrificial film is a sacrificial film 120 and the film stress thereof does not approximate that of an insulating film 102 is illustrated. That is to say, the insulating film 102 and the sacrificial film 120 are alternately laminated without performing the approximation process. The insulating film 102 is made up of an insulating film 102(1), an insulating film 102(2), . . . , and an insulating film 102(8) sequentially from below. Furthermore, the sacrificial film 120 is made up of a sacrificial film 120(1), a sacrificial film 120(2), . . . , and a sacrificial film 120(8) sequentially from below. As described above, the insulating film 102 is formed by heating the wafer 100 to a predetermined temperature and supplying a silicon-containing gas and an oxygen-containing gas onto the wafer 100. The sacrificial film 120 is also formed by heating the wafer 100 to a predetermined temperature different from that of the insulating film 102 and supplying a silicon-containing gas and a nitrogen-containing gas onto the wafer 100.

However, it is generally known that the SiO film has high compressive stress and the SiN film has high tensile stress. That is to say, the SiO film and the SiN film have opposite characteristics with respect to the film stress. The property of these stresses becomes prominent when the films are heated.

In FIG. 15, the formation of the insulating film 102 configured by the SiO film and the formation of the sacrificial film 120 configured by the SiN film are repeated. In some films, the wafer 100 is heated in a state in which both the insulating film 102 and the sacrificial film 120 exist. Thus, the difference in stress between the insulating film 102 and the sacrificial film 120 is high thereby causing, for example, a film delamination between the insulating film 102 and the sacrificial film 120. This may lead to the breakdown of the semiconductor device, a yield reduction, or a property deterioration.

When forming the sacrificial film 120(5), the wafer 100 is heated to form the SiN film. At this time, the insulating film 102(1) to the insulating film 102(5) formed under the sacrificial film 120(5) increase in compressive stress, and the sacrificial film 120(1) to the sacrificial film 120(4) increase in tensile stress. Thus, a difference in stress occurs between the insulating film 102 and the sacrificial film 120. The difference in stress may lead to the breakdown of the semiconductor device, or the like.

In order to reduce such a difference in stress, in this step, the film stress of the sacrificial film 104 is processed such that it approximates the film stress of the insulating film 102. Details of this process method will be described later.
(S106)

In this step, it is determined whether a set of the first insulating film forming step S102 and the sacrificial film forming step S104 mentioned above has been performed a predetermined number of times. That is to say, it is determined whether the combination of the insulating film 102 and the sacrificial film 104 in FIG. 4 has been laminated by a predetermined number. In the present embodiment, for example, eight insulating films (the insulating film 102(1) to the insulating film 102(8)) and eight sacrificial films 104 (a sacrificial film 104(1) to a sacrificial film 104(8)) are alternately formed as eight layers. Furthermore, the sacrificial film 104 is made up of sacrificial film 104(1), sacrificial film 104(2), . . . , sacrificial film 104(8) sequentially from below.

If it is determined in step S106 that the combination has not been performed the predetermined number of times, "NO" is selected and the process returns to the first insulating film forming step S102. If it is determined that the combination has been performed the predetermined number of times, namely if it is determined that the predetermined number of layers has been formed, "YES" is selected and the process goes to a second insulating film forming step S108. Furthermore, while an example in which the insulating films 102 and sacrificial films 104 has been described to be formed as eight layers, respectively, the present disclosure is not limited thereto. In some embodiments, the insulating films 102 and sacrificial films 104 may be formed as nine or more layers, respectively.
(S108)

Figure 4:
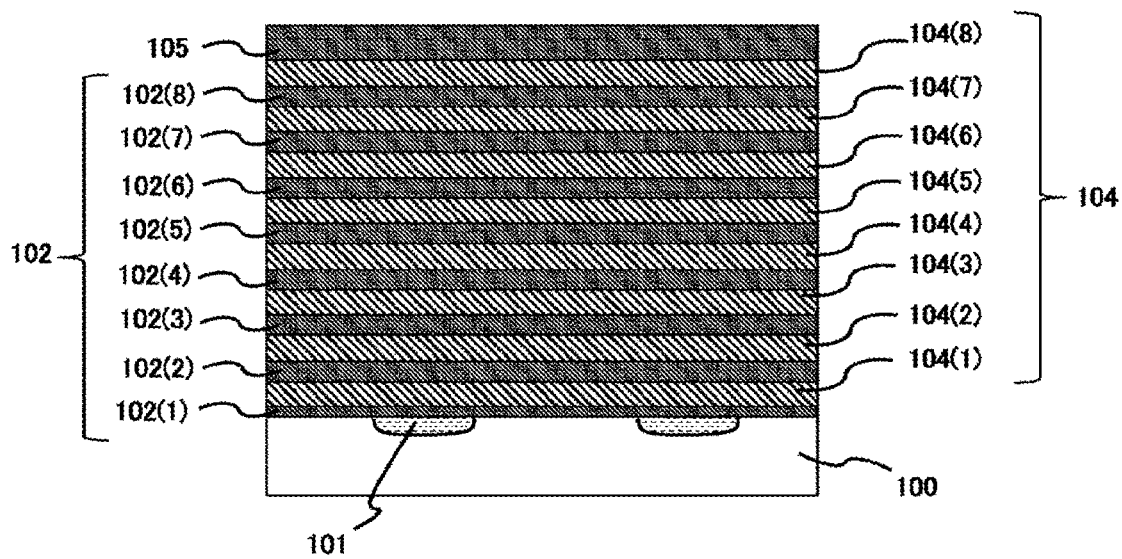
FIG. 4 is an explanatory view illustrating a process state of a wafer according to an embodiment.

Next, the second insulating film forming step S108 will be described. In this step, an insulating film 105 illustrated in FIG. 4 is formed. The insulating film 105 is formed by the same method as that of the insulating film 102 and is formed on the uppermost sacrificial film 104.
(S110)

Figure 5A:
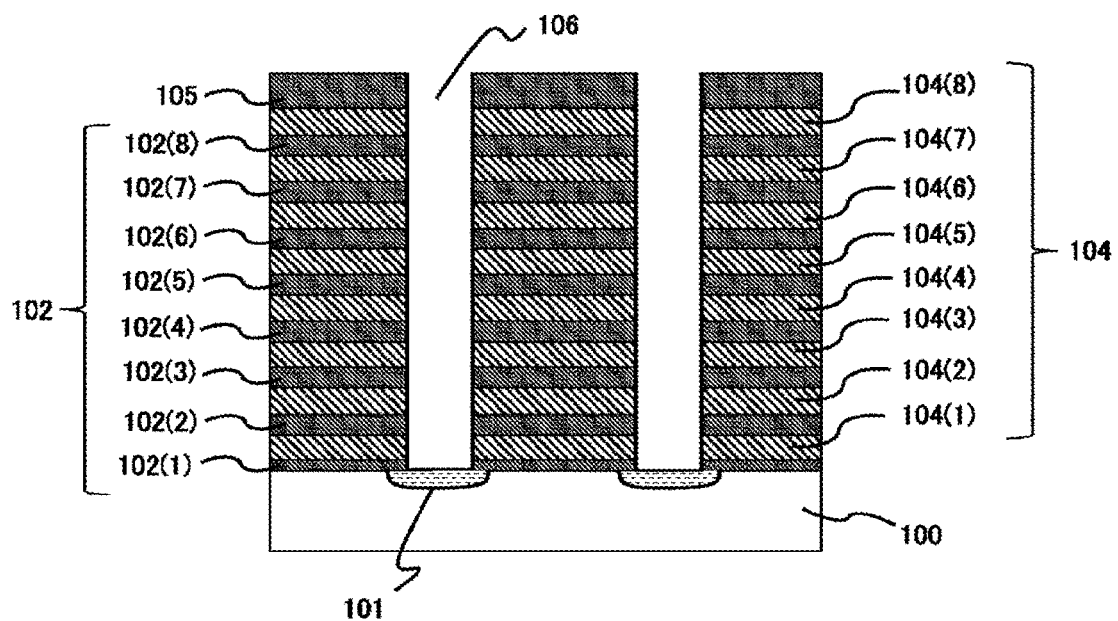
FIGS. 5A and 5B are explanatory views illustrating a process state of a wafer according to an embodiment.
Figure 5B:
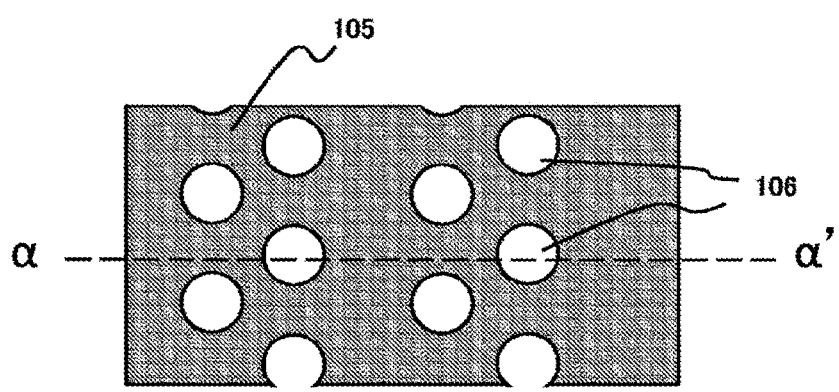

Next, a hole forming step S110 will be described with reference to FIGS. 5A and 5B. FIG. 5A is a side view like FIG. 4, and FIG. 5B is a top view of the configuration of FIG. 5A. Furthermore, a cross sectional view taken along line α-α' of FIG. 5B corresponds to FIG. 5A.

In this step, holes 106 are formed in the laminate structure of the insulating films 102 and 105 and the sacrificial film 104. As illustrated in FIG. 5A, each of the holes 106 is formed to expose the CSL 101. As illustrated in FIG. 5B, a plurality of holes 106 are formed in the plane of the insulating film 105.
(S112)

Next, a hole filling step S112 will be described with reference to FIG. 6. In this step, the inner side of the hole 106 formed in step S110 is filled with a laminated film 108 or the like. A protective film 107, the laminated film 108 of insulating film between gate electrodes-charge trap film-tunnel insulating film, a channel polysilicon film 109, and a filling insulating film 110 are formed within the hole 106 sequentially from an outer peripheral side. Each film is formed in a cylindrical shape.

For example, the protective film 107 is configured by an SiO or metal oxide film. The laminated film 108 of the insulating film between gate electrodes-charge trap film-tunnel insulating film is made up of an SiO—SiN—SiO film. In order to avoid damage to the laminated film 108 when removing the sacrificial film 104, the protective film 107 is formed on a surface of an inner wall of the hole 106 to protect the laminated film 108.
(S114)

Figure 7:
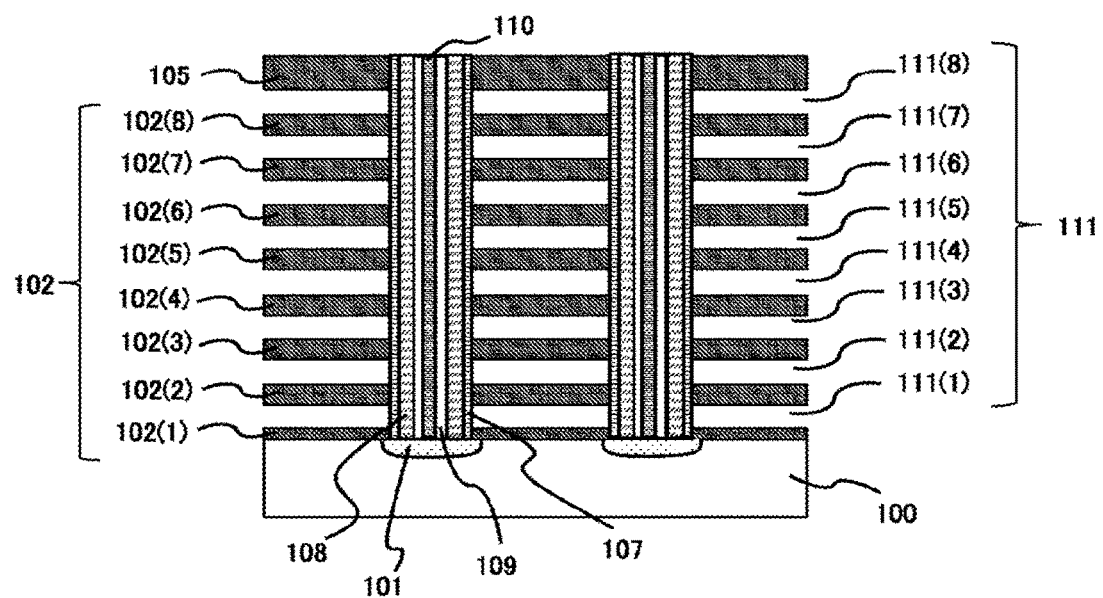
FIG. 7 is an explanatory view illustrating a process state of a wafer according to an embodiment.

Next, the sacrificial film removing step S114 will be described with reference to FIG. 7. In the sacrificial film removing step S114, the sacrificial film 104 is removed by wet etching. As a result of removing the sacrificial film 104, voids 111 are formed at positions where the sacrificial film 104 was formed. Herein, a void 111(1), a void 111(2), ..., a void 111(8) are formed sequentially from below.
(S116)

Next, a conductive film forming step S116 will be described with reference to FIG. 8. In the conductive film forming step S116, a conductive film 112 serving as an electrode is formed in the void 111. The conductive film is made of, for example, tungsten or the like. Here, the conductive film 112 is made up of a conductive film 112(1), a conductive film 112(2), ..., a conductive film 112(8) sequentially from below.

Subsequently, a substrate processing apparatus 200 used in the sacrificial film forming step S104 and a forming method will be described. The substrate processing apparatus 200 will be described with reference to FIGS. 9, 10 and 11. The forming method will be described with reference to FIG. 12 and FIGS. 13A and 13B.
(Substrate Processing Apparatus)
(Process Vessel)

As illustrated in the drawing, the substrate processing apparatus 200 includes a process vessel (vessel) 202. The vessel 202 is configured as, for example, a flat airtight vessel having a circular cross section. Furthermore, the vessel 202 is made of a metal material such as, e.g., aluminum (Al) or stainless steel (SUS). A process chamber 205 in which a wafer 100 such as a silicon wafer or the like is processed and a transfer space 206 through which the wafer 100 passes when transferring the wafer 100 to the process chamber 201 are formed inside the vessel 202. The vessel 202 is made up of an upper vessel 202a and a lower vessel 202b. A partition plate 208 is installed between the upper vessel 202a and the lower vessel 202b. The process chamber 205 includes a dispersion plate 234, a substrate mounting table 212, and the like which will be described later.

A substrate loading/unloading port 204 is formed in a side surface of the lower vessel 202b to be adjacent to the gate valve 203. The wafer 100 is transferred to and from a transfer chamber (not shown) through the substrate loading/unloading port 204. A plurality of lift pins 207 are installed in a lower portion of the lower vessel 202b.

A substrate support part 210 configured to support the wafer 100 is disposed in the process chamber 205. The substrate support part 210 mainly includes a substrate mounting surface 211 on which the wafer 100 is mounted, the substrate mounting table 212 having the substrate mounting surface 211 on its substrate, a heater 213 as a heating source installed within the substrate mounting table 212, and a bias electrode 215. Through holes 214 through which the lift pins 207 pass are formed at positions corresponding to the lift pins 207 on the substrate mounting table 212, respectively. A heater control part (not shown) is connected to the heater 213, so that the heater 213 is heated to a desired temperature according to an instruction provided from a controller 280.

A first power supply line 251a, which is one component of an ion control part 251, is electrically connected to the bias electrode 215. A low-frequency power source 251b and a matcher 251c are installed in the first power supply line 251a sequentially from the respective upstream side. The low-frequency power source 251b is connected to a ground 251d.

Furthermore, a first power output line 252e, which is one component of a plasma generation part 252, is electrically connected to the bias electrode 215. A high pass filter (hereinafter, referred to as an HPF) 252f is installed in the first power output line 252e. The HPF 252f is connected to a ground 252d.

Here, for example, the low frequency ranges from about 1 to 400 KHz and the high frequency is about 13.56 MHz.

The substrate mounting table 212 is supported by a shaft 217. The shaft 217 is configured to penetrate the lower portion of the process vessel 202, and is connected to an elevating part 218 outside the process vessel 202. The shaft 217 is insulated from the process vessel 202.

By operating the elevating part 218 to elevate or lower the shaft 217 and the substrate mounting table 212, the substrate mounting table 212 can elevate or lower the wafer 100 mounted on the substrate mounting surface 211. Furthermore, the periphery of the lower end of the shaft 217 is covered with a bellows 219, so that the interior of the process chamber 205 is hermetically sealed.

Figure 9:
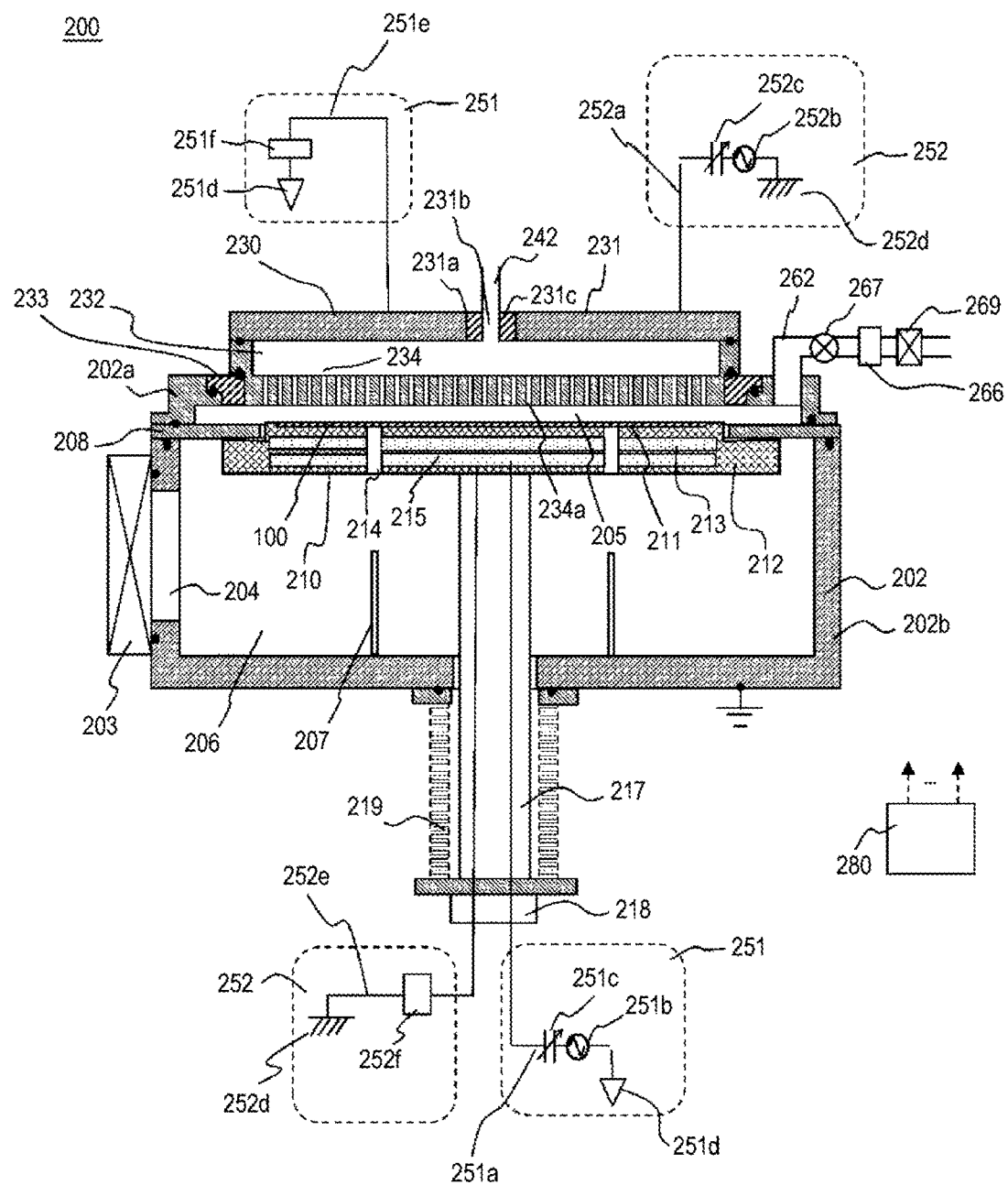
FIG. 9 is an explanatory view illustrating a substrate processing apparatus according to an embodiment.

The substrate mounting table 212 is lowered such that the substrate mounting surface 211 is located at a position of the substrate loading/unloading port 204 when the wafer 100 is transferred. As illustrated in FIG. 9, the substrate mounting table 212 is elevated until the wafer 100 reaches a process position within the process chamber 205 when the wafer 100 is processed.

A shower head 230, which is a gas dispersion mechanism, is installed in an upper portion (upstream side) of the process chamber 205. A through hole 231a is formed in a lid 231 of the shower head 230. An insulator 231c is installed in an inner periphery of the through hole 231a. A gas introduction hole 231b is formed in the insulator 231c. The gas introduction hole 231b communicates with a common gas supply pipe 242. The insulator 231c electrically insulates the common gas supply pipe 242 from the lid 231.

A second power supply line 252a, which is one component of the plasma generation part 252, is connected to the lid 231. A high-frequency power supply 252b and a matcher 252c are installed in the second power supply line 252a sequentially from the respective upstream side. The high-frequency power source 252b is connected to a ground 252d.

Furthermore, a first power output line 251e is connected to the lid 231. A low pass filter (hereinafter referred to as an LPF) 251f, which is a portion of the ion control part 251, is installed in the first power output line 251e. The LPF 251f is connected to a ground 251d.

At least the first power supply line 251a, the matcher 251c, and the first power output line 251e will be collectively referred to as the ion control part 251. Any one of the low-frequency power source 251b as a first power source and the LPF 251f, or a combination thereof may be included in the ion control part 251.

Furthermore, at least the second power supply line 252a, the matcher 252c, and the first power output line 252e will be collectively referred to as the plasma generation part 252. Any one of the high-frequency power source 252b as a second power source and the HPF 252f, or a combination thereof may be included in the plasma generation part 252.

The shower head 230 includes the dispersion plate 234 as a dispersion mechanism for dispersing a gas. The upstream side of the dispersion plate 234 is defined as a buffer space 232, and the downstream side thereof is defined as the process chamber 205. A plurality of through holes 234a is formed in the dispersion plate 234. The dispersion plate 234 is disposed to face the substrate mounting surface 211. The dispersion plate 234 is formed in, for example, a disc shape. The through holes 234a are formed over the entire surface of the dispersion plate 234.

The upper vessel 202a has a flange, on which an insulating support block 233 is mounted and fixed. The support block 233 has a flange, on which the dispersion plate 234 is mounted and fixed. Furthermore, the lid 231 is fixed to the upper surface of the support block 233. The lid 231 and the upper vessel 202a are insulated by the support block 233.

(Gas Supply Part)

Figure 10:
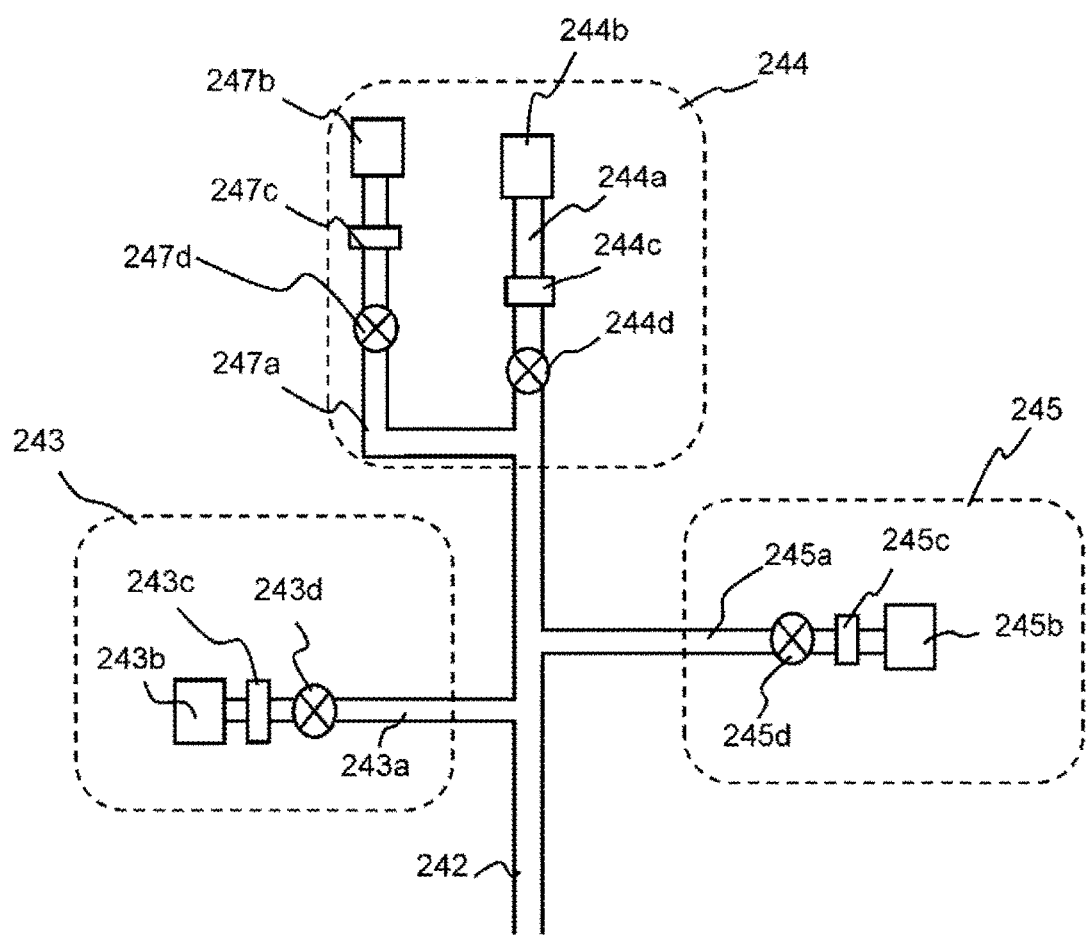
FIG. 10 is an explanatory view illustrating a substrate processing apparatus according to an embodiment.

The common gas supply pipe 242 is connected to the lid 231 so as to communicate with the gas introduction hole 231b formed in the lid 231. As illustrated in FIG. 10, a first gas supply pipe 243a, a second gas supply pipe 244a, and a third gas supply pipe 245a are connected to the common gas supply pipe 242.

(First Gas Supply System)

A first gas source 243b, a mass flow controller (MFC) 243c, which is a flow rate controller (flow rate control part), and a valve 243d, which is an opening/closing valve, are installed in the first gas supply pipe 243a sequentially from the respective upstream side.

The first gas source 243b is a source of a first gas containing a first element (also referred to as a "first element-containing gas"). The first element-containing gas is a precursor gas, i.e., one of the process gases. Here, the first element is silicon (Si). That is to say, the first element-containing gas is a silicon-containing gas. Specifically, as the silicon-containing gas, it may be possible to use a dichlorosilane ($SiH_2Cl_2$, also referred to as DCS) gas or a hexachlorodisilane ($Si_2Cl_6$, also referred to as HCDS) gas.

A first gas supply system 243 (also referred to as a silicon-containing gas supply system) is mainly configured by the first gas supply pipe 243a, the MFC 243c, and the valve 243d.

(Second Gas Supply System)

A second gas source 244b, an MFC 244c, which is a flow rate controller (flow rate control part), and a valve 244d, which is an opening/closing valve, are installed in the second gas supply pipe 244a sequentially from the respective upstream side.

The second gas source 244b is a source of a second gas containing a second element (hereinafter, also referred to as a "second element-containing gas"). The second element-containing gas is one of the process gases. Furthermore, the second element-containing gas may be regarded as a reaction gas.

Here, the second element-containing gas contains a second element different from the first element. The second element is, for example, nitrogen (N). In the present embodiment, the second element-containing gas is, for example, a nitrogen-containing gas. Specifically, as the nitrogen-containing gas, it may be possible to use an ammonia ($NH_3$) gas.

A second gas supply system 244 (also referred to as a reaction gas supply system) is mainly made up of the second gas supply pipe 244a, the MFC 244c, and the valve 244d.

A gas supply pipe 247a is connected to the second gas supply pipe 244a at the downstream side of the valve 244d. An assist gas source 247b, an MFC 247c, and a valve 247d are installed in the gas supply pipe 247a from the respective upstream side. As the assist gas, it may be possible to use, for example, a gas having a large molecular size such as argon (Ar). The gas supply pipe 247a, the MFC 247c, and the valve 247d will be collectively referred to as an assist gas supply part. The assist gas source 247b may also be included in the assist gas supply part. The assist gas supply part may also be included in the second gas supply system 244.

(Third Gas Supply System)

A third gas source 245b, an MFC 245c, which is a flow rate controller (flow rate control part), and a valve 245d, which is an opening/closing valve, are installed in the third gas supply pipe 245a sequentially from the respective upstream side.

The third gas source 245b is an inert gas source. The inert gas is, for example, a nitrogen ($N_2$) gas.

A third gas supply system 245 is mainly configured by the third gas supply pipe 245a, the MFC 245c, and the valve 245d.

The inert gas supplied from the third gas source 245b acts as a purge gas for purging the gas remaining within the vessel 202 or the shower head 230 in the substrate processing process.

Furthermore, any one of the first gas supply system, the second gas supply system, and the third gas supply system, or a combination thereof will be referred to as a process gas supply part.

(Exhaust System)

An exhaust system configured to exhaust the atmosphere of the vessel 202 will be described. An exhaust pipe 262 is connected to the vessel 202 so as to communicate with the process chamber 205. An auto pressure controller (APC) 266 which is a pressure controller for controlling the interior of the process chamber 205 so as to reach a predetermined pressure is installed in the exhaust pipe 262. The APC 266 includes a valve element (not shown) whose opening degree is adjustable, and is configured to adjust the conductance of the exhaust pipe 262 according to an instruction provided from the controller 280. In addition, a valve 267 is installed in the exhaust pipe 262 at the upstream side of the APC 266. The exhaust pipe 262, the valve 267, and the APC 266 will be collectively referred to as the exhaust system.

Furthermore, a dry pump (DP) 269 is installed. The DP 269 is configured to exhaust the atmosphere of the process chamber 201 via the exhaust pipe 262.

(Controller)

Figure 11:
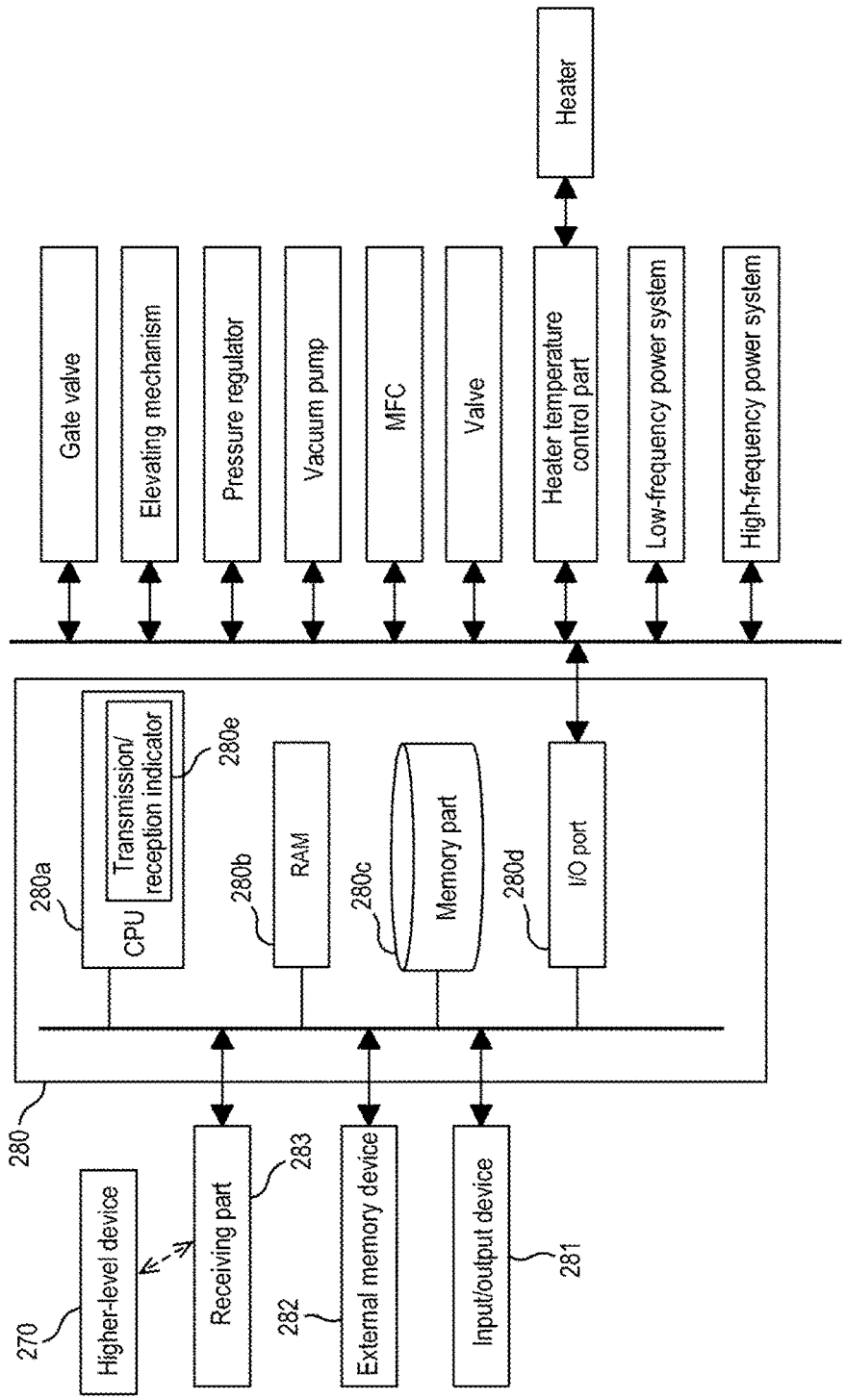
FIG. 11 is an explanatory view illustrating a substrate processing apparatus according to an embodiment.

The substrate processing apparatus 200 includes the controller 280 configured to control the operations of the respective parts of the substrate processing apparatus 200. As illustrated in FIG. 11, the controller 280 includes at least an operation part (CPU) 280a, a temporary memory part 280b, a memory part 280c, and an I/O port 280d. The controller 280 is connected to each part of the substrate processing apparatus 200 via the I/O port 280d, and invokes a program or a recipe from the memory part 280c according to an instruction from a higher-level device 270 or the user, and controls, according to the contents thereof, the operation of each part such as the ion control part 251 or the plasma generation part 252. The transmission/reception control is performed by, for example, a transmission/reception indicator 280e in the operation part 280a. Furthermore, the controller 280 may be configured as a dedicated computer or as a general-purpose computer. For example, the controller 280 according to the present embodiment may be configured by installing, on a general-purpose computer, the program stored in an external memory device 282 (for example, a magnetic tape, a magnetic disk such as a flexible disk or a hard disk, an optical disc such as a CD or a DVD, a magneto-optical disc such as an MO, or a semiconductor memory such as a USB memory (USB flash drive) or a memory card) using the external memory device 282. Furthermore, means for supplying the program to the computer is not limited to being supplied via the external memory device 282. For example, the program may be supplied to the computer using a communication means such as the Internet or a dedicated line. Alternatively, the program may be supplied to the computer by receiving information from the higher-level device 270 through a receiving part 283, instead of using the external memory device 282. In addition, an instruction may be issued to the controller 280 using an input/output device 281 such as a keyboard or a touch panel.

Furthermore, the memory part 280c or the external memory device 282 is configured as a non-transitory computer-readable recording medium. Hereinafter, the memory part 280c and the external memory device 282 will be generally and simply referred to as a "recording medium." When the term "recording medium" is used herein, it may indicate a case of including only the memory part 280c, a case of including only the external memory device 282, or a case of including both the memory part 282c and the external memory device 282.

Subsequently, details of the sacrificial film forming step S104 in FIG. 1 will be described.

(Sacrificial Film Forming Step S104)

Next, an example in which an HCDS gas is used as a first process gas and an ammonia ($NH_3$) gas is used as a second process gas to form a sacrificial film 104 will be described. The sacrificial film is formed of a silicon nitride film (SiN film).

Once the wafer 100 with the insulating film 102 formed thereon is loaded into the vessel 202, the gate valve 203 is closed to hermetically seal the inside of the vessel 202. Thereafter, the wafer 100 is mounted on the substrate mounting surface 211 formed in the substrate mounting table 212 by elevating the substrate mounting table 212. Furthermore, the wafer 100 is elevated to the process position (substrate process position) within the process chamber 205 described above by further elevating the substrate mounting table 212.

When the wafer 100 is mounted on the substrate mounting table 212, electric power is applied to the heater 213 embedded in the substrate mounting table 212 to control the surface of the wafer 100 to have a predetermined temperature. The temperature of the wafer 100 may be, for example, room temperature to 800 degrees C., specifically room temperature to 700 degrees C. At this time, the temperature of the heater 213 is adjusted by extracting a control value by the controller 280 based on the temperature information detected by a temperature sensor (not shown) and controlling a state of supplying the electric power to the heater 213 by a temperature control part (not shown).

Subsequently, the operation of each of the gas supply part, the ion control part 251, and the plasma generation part 252 will be described with reference to a timing chart illustrated in FIG. 12. Furthermore, a relationship between the operation timing of FIG. 12 and the process state of the substrate will be described with reference to FIGS. 13A and 13B.

Figure 12:
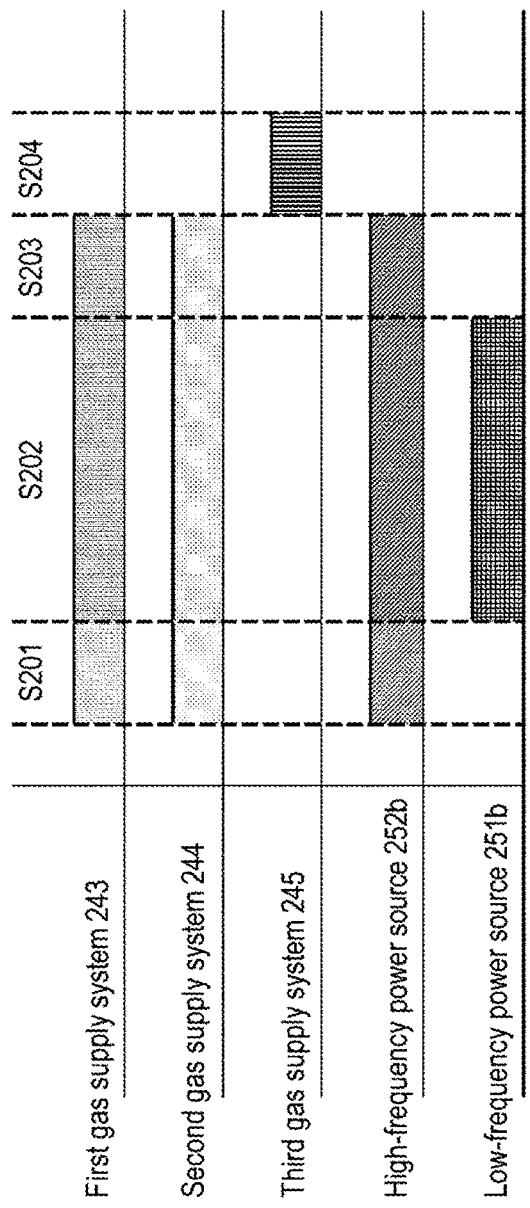
FIG. 12 is a timing chart illustrating an operation of the substrate processing apparatus according to the embodiment.

In addition, in FIG. 12, a state in which each component is being operated is indicated by shaded portions. For example, in a portion shaded in the first gas supply system 243, it indicates that the first gas is supplied to the process chamber 205 by controlling the MFC 243c and the like of the first gas supply system 243. In the second gas supply system 244, it indicates that the second gas is supplied to the process chamber 205 by controlling the MFC 244c and the like of the second gas supply system 244. In the third gas supply system 245, it indicates that the inert gas is supplied to the process chamber 205 by controlling the MFC 245c and the like of the third gas supply system 245. In a portion shaded in the high-frequency power source 252b, it indicates a state in which the high-frequency power is supplied to the process chamber 205 by operating the high-frequency power source 252b. In a portion shaded in the low-frequency power source 251b, it indicates a state in which the low-frequency power is supplied to the process chamber 205 by operating the low-frequency power source 251b. Furthermore, the state in which the high-frequency power source 252b is operated will be referred to as a state in which the plasma generation part is operated, and the state in which the low-frequency power source 251b is operated will be referred to as a state in which the ion control part is operated. In the present embodiment, the high-frequency power will be referred to as a first power, and the low-frequency power will be referred to as a second power.

Figure 13A:
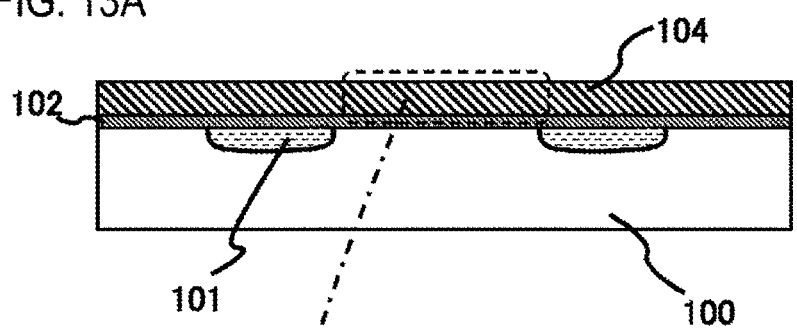
FIGS. 13A and 13B are explanatory views illustrating a process state of a wafer according to an embodiment.
Figure 13B:
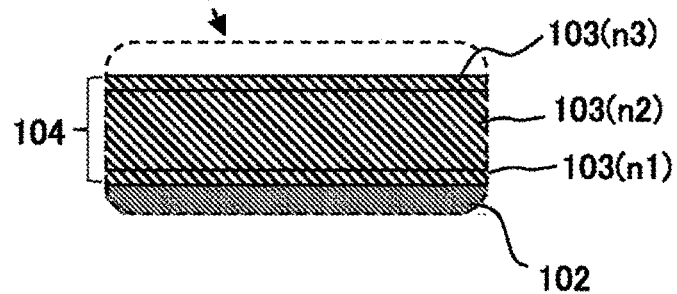

FIGS. 13A and 13B are views illustrating process states of the wafer 100. FIG. 13A is a view having the same contents as in FIG. 3, and FIG. 13B is an enlarged view of a portion of FIG. 13A. Specifically, FIG. 13B is an enlarged view of portions of the insulating film 102 and the sacrificial film 104. Furthermore, a silicon nitride layer 103(n1), a silicon nitride layer 103(n2), and a silicon nitride layer 103(n3) in FIG. 13B illustrate layers constituting the sacrificial film 104. That is to say, the sacrificial film 104 includes a plurality of silicon nitride layers 103. In addition, while in this example, three layers have been described, the present disclosure is not limited thereto. The silicon nitride layer 103(n) will also be referred to as a first silicon nitride layer, the silicon nitride layer 103(n2) will also be referred to as a second silicon nitride layer, and the silicon nitride layer 103(n3) will also be referred to as a third silicon nitride layer.

However, for example, when the sacrificial film 104 is formed using an HCDS gas and an $NH_3$ gas in a plasma state, a decomposed HCDS gas and an $NH_3$ gas in a plasma state exist in the process chamber 201. That is to say, respective components of Si, chlorine (Cl), nitrogen (N), and hydrogen (H) exist in a mixed state in the process chamber 205. In this state, Si and nitrogen are mainly bonded to form the sacrificial film 104 formed of an SiN film.

When forming the sacrificial film 104, both components of chlorine (Cl) and hydrogen (H) as impurities exist in the process chamber 201 in addition to Si and N as main ingredients. Thus, in the process of forming the SiN film, Si may be bonded to Cl or H, or N bonded to Si may be bonded to Cl or H. These components are introduced into the SiN film. As a result of extensive research by the present inventor, it was found that the bond to an impurity is a factor of tensile stress.

As described above, the tensile stress of the sacrificial film 104 leads to a difference in stress from the insulating film 102. Thus, in the present embodiment, when forming the sacrificial film 104, it is configured such that the tensile stress of the sacrificial film 104 approximates the film stress of the insulating film 102. Specifically, as illustrated in FIGS. 13A and 13B, it is configured such that at least a thin silicon nitride layer 103(n1) and a thick silicon nitride layer 103(n2) are formed, and the higher tensile stress of the silicon nitride layer 103(n2) approximates the film stress of the insulating film 102.

Specific contents will be described below.

(S201)

In this step, the silicon nitride layer 103(n1) is formed on a surface making contact with the insulating film 102. When the wafer 100 is maintained at a predetermined temperature, an HCDS gas is supplied from the first gas supply system 243 to the process chamber 205 and an $NH_3$ gas is also supplied from the second gas supply system 244 to the process chamber 205.

Subsequently, when the interior of the process chamber 201a has a predetermined pressure, the plasma generation part 252 starts to supply a high frequency into the process chamber 205. Specifically, the high-frequency power source 252b is operated to supply the electric power. A portion of the process gas inside the process chamber 205 is ionized to be in a plasma state. The HCDS gas and the $NH_3$ gas in a plasma state react with each other inside the process chamber 205 and are supplied onto the insulating film 102.

When a predetermined time has lapsed from the start of the supply of the high frequency, as illustrated in FIGS. 13A and 13B, reaction products are deposited on the insulating film 102 to form a dense silicon nitride layer 103($n1$). The silicon nitride layer 103($n1$) will also be referred to as the first silicon nitride layer.

The thickness of the silicon nitride layer 103($n1$) is set such that it does not have an affect on the stress of the sacrificial film and it is thinner than at least the silicon nitride layer 103($n2$).

(S202)

The first wafer 100 is formed on the silicon nitride layer 103($n1$) and after the lapse of a predetermined time, the ion control part 251 operates the low-frequency power source 251b to start the supply of a low frequency into the process chamber 205, while maintaining the supply of the high frequency from the plasma generation part 252.

The process gas turns into a high density plasma state by the high frequency and ions of the plasma are irradiated to the wafer 100 by the low frequency.

Among the gases in a plasma state, Si and nitrogen are mainly bonded and supplied onto the insulating film 102 to form the silicon nitride layer 103($n2$). In parallel with this, impurity bonds occur in the process chamber 205. There is a possibility that the impurity bonds are introduced into the silicon nitride layer 103($n2$). Furthermore, the impurity bonds have at least one of, for example, an Si—Cl bond in which Si and Cl are bonded, an Si—H bond in which Si and H are bonded, an Si—NCl bond in which Si—N and Cl are bonded, an Si—NH bond in which Si—N and H are bonded, and the like.

However, in this step, an ion component such as nitrogen or the like is supplied to the impurity bonds of the silicon nitride layer 103($n2$) that is under formation by the low frequency, thus breaking the bonds. This forms the silicon nitride layer 103($n2$) having compressive stress.

Furthermore, since the process gas turns into a high density plasma state by the high frequency and the nitrogen ions are irradiated to the wafer 100 by the low frequency, it is possible to increase a deposition rate, compared with only the high frequency as in step S201. Thus, it is possible to form the silicon nitride layer 103($n2$) at an early stage.

In some embodiments, in step S202, an assist gas for assisting breaking the bonds of an impurity such as argon (Ar) or the like may be included in the process gas. Since a molecular size of Ar is greater than that of nitrogen, it is possible to promote breaking of a bonding portion of the impurity bonds generated when the silicon nitride layer 103($n2$) is formed. At this time, in order to adjust the stress, a supply amount of Ar may be adjusted. The MFC 247c or the valve 247b is controlled to adjust the supply amount of Ar. For example, it is adjusted such that the supply amount of Ar is increased to lower the stress and decreased to elevate the stress.

In this manner, the tensile stress, which is the film stress of the silicon nitride layer 103($n2$), can be reduced by breaking the bond to the impurity.

However, in this step, not only the bond to the impurity but also the Si—N bond may be broken. For example, when broken, it is considered that the film quality, including decreased film density or increased etching rate, will deteriorate. However, as illustrated in FIG. 7, since the sacrificial film 104 is removed at a subsequent sacrificial film removing step S114, even if the film quality deteriorates, there is no problem.

In some embodiments, the low frequency may be supplied in the form of a pulse. This is because, since ions or electrons having high energy such as nitrogen or the like constantly collide with the wafer 100 to react with each other as the low frequency is continuously applied, the temperature of the silicon nitride layer 103($n2$) may be rapidly increased to affect another film. By supplying the low frequency in the form of a pulse, the constant reaction can be prevented, suppressing the rapid increase of the temperature of the silicon nitride layer 103($n2$).

Furthermore, when supplying at least a low frequency as in step S202, it is desirable to set the high-frequency power supplied from the high-frequency power source 252b larger than that in step S201. Since the decomposition can be promoted by increasing the electric power, it is possible to further improve the deposition rate and to more quickly form the silicon nitride layer 103($n2$).

In addition, in FIGS. 13A and 13B, there has been described an example in which the sacrificial film 104 is formed on the first layer of the insulating film 102. However, the present disclosure is not limited thereto and it may be formed on the second or higher layer. For example, this step may be used for the sacrificial films 104(5) and 104(7) and the like in FIG. 6.

(S203)

When a predetermined time has elapsed in step S202, the plasma generation part 252 maintains the supply of the high frequency while the ion control part 251 stops the supply of the low frequency. The process gas in a plasma state by the high frequency forms a silicon nitride layer 103($n3$) on the silicon nitride layer 103($n2$). The silicon nitride layer 103($n3$) has the same properties as those of the silicon nitride layer 103($n1$). The silicon nitride layer 103($n3$) is set at a thickness such that it does not affect on the stress of the sacrificial film. Further, the silicon nitride layer 103($n3$) is a film thinner than at least the silicon nitride layer 103($n2$), and is a film with low stress. Furthermore, as illustrated in FIG. 4, the insulating film 102 is formed on the silicon nitride layer 103($n3$).

(S204)

When a predetermined time has elapsed in step S203, the supply of the process gas and the supply of the high-frequency power are stopped, and the inert gas is supplied from the third gas supply system to exhaust the atmosphere of the process chamber. After the exhaust, the wafer 100 is unloaded and moved to an insulating film forming apparatus (not shown) where the insulating film 102 is formed on the sacrificial film 104.

Figure 6:
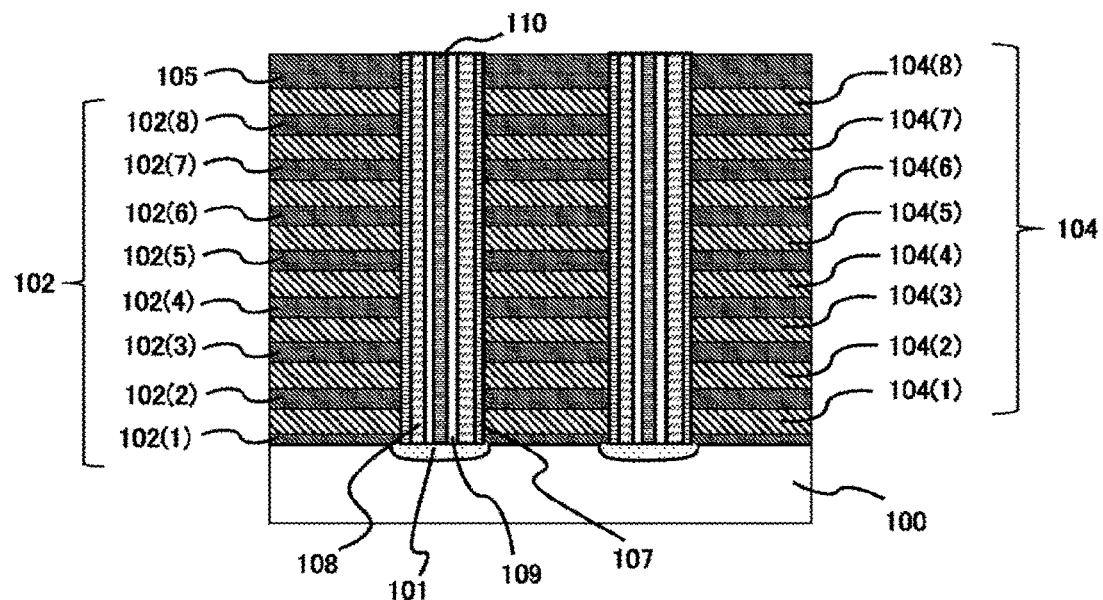
FIG. 6 is an explanatory view illustrating a process state of a wafer according to an embodiment.

As described above, by forming the sacrificial film 104 in which the compressive stress of the silicon nitride layer 103($n2$) is reduced, even if the insulating film 102 and the sacrificial film 104 are alternately laminated as in FIGS. 4 to 6, it is possible to limit the breakdown of the semiconductor device or the yield reduction of the semiconductor device, which is caused by a stress difference or the like.

However, the insulating films 102 are formed above and below the sacrificial film 104 including the silicon nitride layer 103($n1$), the silicon nitride layer 103($n2$), and the silicon nitride layer 103($n3$), as illustrated in FIG. 6.

The insulating film 102 has an oxygen component mixed therein. Thus, it is considered that the oxygen component migrates when the wafer 100 is heated. In particular, in the case of a film in which a bond is broken like the silicon nitride layer 103(n2), the likelihood of the migrated oxygen component to penetrate should be considered.

Thus, in the present embodiment, the silicon nitride layer 103(n1), which is a dense nitride layer, is formed between the lower insulating film 102 and the silicon nitride layer 103(n2). Here, the dense nitride layer refers to a nitride layer with a high bonding degree. The high bonding degree refers to a state in which bonds of Si and N as main ingredients, or impurity bonds are large. That is to say, it refers to a state in which the dense nitride layer has a bonding degree higher than that of the silicon nitride layer 103(n2). In this case, since the silicon nitride layer 103(n1) serves as a wall, it is possible to prevent the migration of the oxygen component of the insulating film 102 formed below the silicon nitride layer 103(n1) to the silicon nitride layer n2.

Furthermore, in the present embodiment, the silicon nitride layer 103(n4), which is a dense nitride layer, is formed between the upper insulating film 102 and the silicon nitride layer 103(n2). Since the silicon nitride layer 103(n3) serves as a wall, it is possible to prevent the migration of the oxygen component of the insulating film 102 formed above the silicon nitride layer 103(n3) to the silicon nitride layer 103(n2).

As described above, the silicon nitride layer 103(n2) serving to reduce the stress of the entire laminated film has low film density and is likely to oxidize. Thus, it is desirable to form the dense silicon nitride layer 103(n1) or the silicon nitride layer 103(n2) between the insulating film 102 and the silicon nitride layer 103(n2).

For example, unlike the present embodiment, a case where the silicon nitride layer 103(n1) or the silicon nitride layer 103(n2) is not formed is considered. In this case, the oxygen component of the insulating film 102 may penetrate the sacrificial film 104 to oxidize the sacrificial film 104. Since such an oxidation is not intended, consideration should be given to the oxygen component being unevenly oxidized.

However, as generally known, when the silicon nitride layer is oxidized, an etching rate may be lowered or dielectric constant may be increased. When a device is manufactured in such a state, for example, the following problems occur. Although it is attempted to etch the sacrificial film 104 in the sacrificial film removing step S114, a portion of the oxidized sacrificial film 104 cannot be etched. This may cause a variation in an etching amount.

Figure 14A:
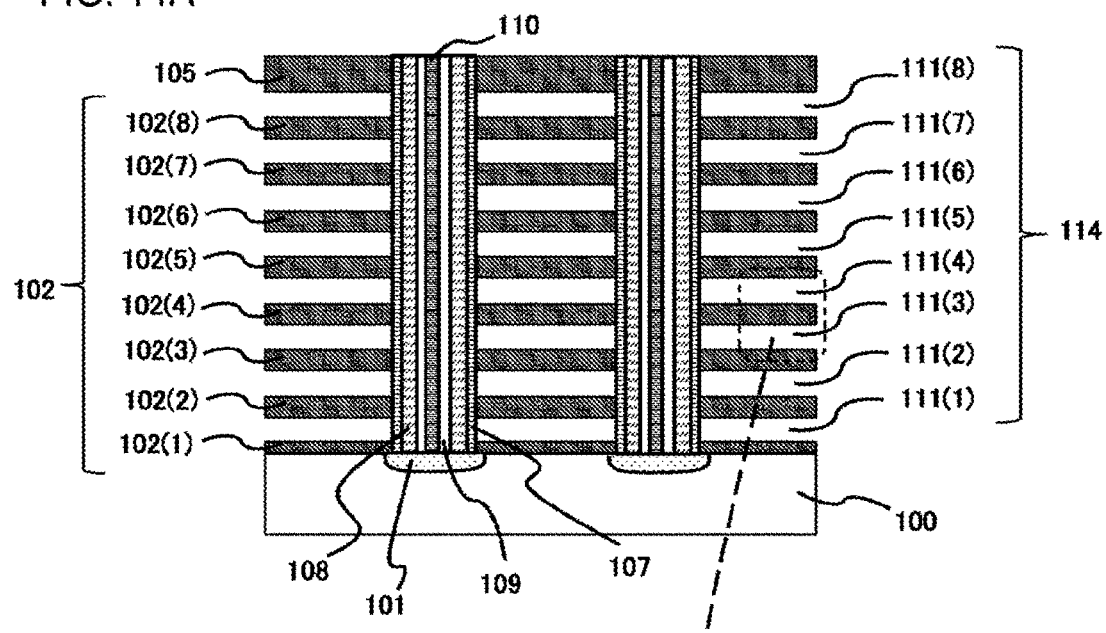
FIGS. 14A and 14B are explanatory views illustrating a process state of a wafer according to Comparative example.
Figure 14B:
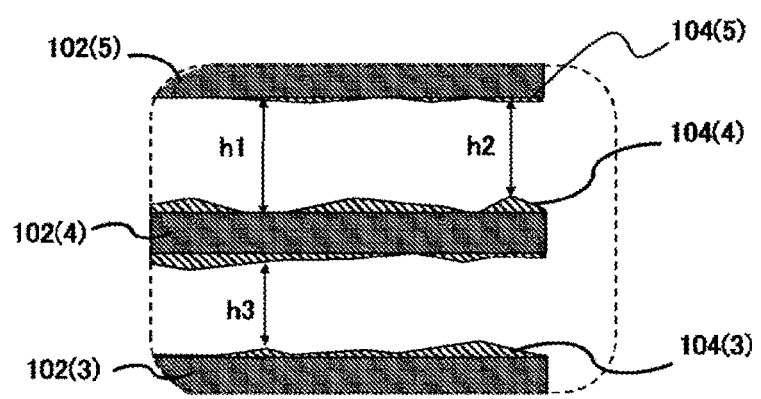

This will be described with reference to FIGS. 14A and 14B which is a Comparative example. FIG. 14A is a view illustrating a state after the oxidized sacrificial film 104 is etched. FIG. 14B is an enlarged view of a portion of FIG. 14A, illustrating a variation in an etching amount mentioned above. When the etching amount varies in this way, an oxidized portion of the sacrificial film 104 may remain above and below the insulating film 102 as illustrated in FIG. 14B.

The variation in the oxidized portion of the sacrificial film 104 refers to a variation in height in a horizontal direction. For example, it refers to a variation in distances h1 and h2 between the insulating film 102(4) (or the remaining sacrificial film 104(4)) and the insulating film 102(5) (or the remaining sacrificial film 104(5)). Or, it refers to a variation in a vertical direction. For example, it refers to a variation in the distance h1 between the insulating film 102(4) (or the remaining sacrificial film 104(4) and the insulating film 102(5) (or the remaining sacrificial film 104(5)) and a distance h3 between the insulating film 102(3) (or the remaining sacrificial film 104(3)) and the insulating film 102(4) (or the remaining sacrificial film 104(4)). When a device is manufactured in such a state, a variation in characteristics such as electrical capacity, a resistance value or the like occurs between the conductive films 112.

On the other hand, by forming the dense silicon nitride layer 103(n1) on the insulating film 102 in step S201 as in the present embodiment, it is possible to suppress the oxidation of the silicon nitride layer 103(n1) and the silicon nitride layer 103(n2) of the sacrificial film 104.

Furthermore, in step S203, by forming the dense silicon nitride layer 103(n3) on the silicon nitride layer 103(n2), it is possible to suppress the migration of the oxygen component from right above insulating film 102 (for example, indicating the insulating film 102(3) making contact with the sacrificial film 104(2) when the silicon nitride layer 103(n3) is a portion of the sacrificial film 104(2)). Thus, it is possible to prevent the oxidation of the sacrificial film 104, particularly the silicon nitride layer 103(n2). Furthermore, the dense nitride layer refers to a nitride layer having a high bonding degree, like the silicon nitride layer 103(n1). That is to say, it indicates a state in which the bonding degree is higher than that of the silicon nitride layer 103 (n2).

Moreover, in the present embodiment, the sacrificial film 104 has been described to be formed while being divided into three layers, but it may be divided and formed into three or more layers.

Furthermore, in the present embodiment, there has been described an example in which the breakdown of the semiconductor device occurs due to a difference in thermal expansion coefficient between the insulating film and the sacrificial film, but the present disclosure is not limited thereto. For example, when the holes 106 illustrated in FIGS. 5A and 5B are formed, there is a possibility that the breakdown of the semiconductor device occurs due to a problem of film stress of the insulating film or the sacrificial film. However, by reducing the film stress of the insulating film or reducing the film stress of the sacrificial film as in the aforementioned embodiment, it is possible to prevent the breakdown of the semiconductor device when forming the holes 106.

In addition, the sacrificial film has been described to be formed by simultaneously supplying two gases to the process chamber in each of steps S201, S202, and S203 in the present embodiment, but the present disclosure is not limited thereto. For example, the sacrificial film may be formed on the insulating film 102 by performing an alternate supply process of alternately supplying the gases. Specifically, a layer mainly made of silicon may be formed by supplying an HCDS gas onto the insulating film 102, and thereafter, ammonia may be supplied and decomposed to react with the layer mainly made of silicon to form an SiN layer. In some embodiments, the alternate supply process may be performed in step S201 in which a dense film is required, and the film may be formed by simultaneously supplying the gases to the process chamber as in the aforementioned embodiment in step S202 in which a high deposition rate is required. Here, the reaction may be promoted by activating any one of the HCDS gas and the $NH_3$ gas or both.

Furthermore, in the present embodiment, the low-frequency power source has been described to be used as one component of the ion control part 251, but the present disclosure is not limited thereto. For example, a high-frequency power source may be used as long as it can attract an ion component. However, it is possible that the low-frequency power source controls migration of ions more greatly, compared with the high-frequency power source, in terms of the characteristics of each power source. Thus, it is desirable to use the low frequency.

In addition, while in FIG. 4 or the like, the insulating film 102 and the sacrificial film 104 has been described to be alternately formed as eight layers, the present disclosure is not limited thereto. For example, the insulating film 102 and the sacrificial film 104 may be formed in more than eight layers. As the number of layers increases, it may be easily affected by the stress. Thus, the technique described in the present embodiment is more effective.

According to the present disclosure in some embodiments, it is possible to provide a technique capable of forming a semiconductor device with good characteristics even in a flash memory having a three-dimensional structure.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
    supplying a process gas to a process chamber in a state in which a substrate with an insulating film formed thereon is mounted on a substrate support part inside the process chamber;
    forming a first silicon nitride layer on the insulating film by supplying a first electric power from a plasma generation part to the process chamber and generating plasma of the process gas; and
    forming a second silicon nitride layer, whose stress is lower than a stress of the first silicon nitride layer, on the first silicon nitride layer by supplying a second electric power from an ion control part to the process chamber in addition to supplying the first electric power and generating the plasma of the process gas.

2. The method of claim 1, wherein in the act of forming the first silicon nitride layer, the plasma generation part is configured to supply a high-frequency power to the process chamber, and
    in the act of forming the second silicon nitride layer, the plasma generation part is configured to supply a high-frequency power to the process chamber and the ion control part is configured to supply a low-frequency power to the process chamber.

3. The method of claim 2, wherein, after the act of forming the second silicon nitride layer, the supply of the second electric power from the ion control part is stopped while the supply of the first electric power from the plasma generation part continues so that a third silicon nitride layer is formed on the second silicon nitride layer.

4. The method of claim 3, wherein the ion control part includes a low-frequency power source, the low-frequency power source being configured to supply a low frequency in the form of a pulse.

5. The method of claim 4, wherein the process gas contains argon.

6. The method of claim 5, wherein a magnitude of the first electric power in the act of forming the first silicon nitride layer is configured to be greater than that of a high-frequency power in the act of forming the second silicon nitride layer.

7. The method of claim 3, wherein the process gas contains argon.

8. The method of claim 2, wherein the ion control part includes a low-frequency power source, the low-frequency power source being configured to supply a low frequency in the form of a pulse.

9. The method of claim 8, wherein the process gas contains argon.

10. The method of claim 2, wherein the process gas contains argon.

11. The method of claim 1, wherein, after the act of forming the second silicon nitride layer, the supply of the second electric power from the ion control part is stopped while the supply of the first electric power from the plasma generation part continues so that a third silicon nitride layer is formed on the second silicon nitride layer.

12. The method of claim 11, wherein the ion control part includes a low-frequency power source, the low-frequency power source being configured to supply a low frequency in the form of a pulse.

13. The method of claim 12, wherein the process gas contains argon.

14. The method of claim 11, wherein the process gas contains argon.

15. The method of claim 1, wherein the ion control part includes a low-frequency power source, the low-frequency power source being configured to supply a low frequency in the form of a pulse.

16. The method of claim 15, wherein the process gas contains argon.

17. The method of claim 1, wherein the process gas contains argon.

18. The method of claim 17, wherein a magnitude of the first electric power in the act of forming the first silicon nitride layer is configured to be greater than that of a high-frequency power in the act of forming the second silicon nitride layer.

19. The method of claim 1, wherein a magnitude of the first electric power in the act of forming the first silicon nitride layer is configured to be greater than that of a high-frequency power in the act of forming the second silicon nitride layer.

* * * * *